US009114425B2

(12) United States Patent
Zagdoun et al.

(10) Patent No.: US 9,114,425 B2
(45) Date of Patent: Aug. 25, 2015

(54) METHOD FOR MANUFACTURING A MASK HAVING SUBMILLIMETRIC APERTURES FOR A SUBMILLIMETRIC ELECTRICALLY CONDUCTIVE GRID, MASK HAVING SUBMILLIMETRIC APERTURES AND SUBMILLIMETRIC ELECTRICALLY CONDUCTIVE GRID

(75) Inventors: Georges Zagdoun, La Garenne Colombes (FR); Bernard Nghiem, Arsy (FR); Emmanuel Valentin, Le Plessis Trevise (FR); Svetoslav Tchakarov, Sceaux (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 1174 days.

(21) Appl. No.: 13/120,265

(22) PCT Filed: Sep. 24, 2009

(86) PCT No.: PCT/FR2009/051815
§ 371 (c)(1),
(2), (4) Date: Jun. 23, 2011

(87) PCT Pub. No.: WO2010/034944
PCT Pub. Date: Apr. 1, 2010

(65) Prior Publication Data
US 2011/0240343 A1 Oct. 6, 2011

(30) Foreign Application Priority Data

Sep. 24, 2008 (FR) ..................................... 08 56427

(51) Int. Cl.
*B05D 1/32* (2006.01)
*H05K 3/04* (2006.01)
(Continued)

(52) U.S. Cl.
CPC .............. *B05D 1/322* (2013.01); *C03C 17/002* (2013.01); *C03C 17/06* (2013.01); *C03C 17/23* (2013.01);
(Continued)

(58) Field of Classification Search
None
See application file for complete search history.

(56) References Cited

U.S. PATENT DOCUMENTS 3,860,424 A * 1/1975 Johnson ........................ 430/139
4,435,047 A 3/1984 Fergason
(Continued)

FOREIGN PATENT DOCUMENTS

DE           197 33 053          2/1999
DE      20 2005 000 979          7/2006
(Continued)

OTHER PUBLICATIONS

Notice of Reasons for Rejection issued for Japanese Patent Application No. 2011-528400, dated Nov. 19, 2013.
(Continued)

*Primary Examiner* — Timothy Meeks
*Assistant Examiner* — Michael P Rodriguez
(74) *Attorney, Agent, or Firm* — Pillsbury Winthrop Shaw Pittman LLP

(57) ABSTRACT

A process for manufacturing a mask having submillimetric openings, in which: for a masking layer, a solution of colloidal nanoparticles that are stabilized and dispersed in a first solvent is deposited, the particles having a given glass transition temperature $T_g$, the drying of the masking layer is carried out at a temperature below the temperature $T_g$ until a mask having a two-dimensional network of submillimetric openings is obtained with substantially straight mask area edges, in a zone referred to as a network mask zone, a zone free of masking is formed on the face by mechanical and/or optical removal of at least one peripheral portion of the network mask zone. The invention also relates to the network mask and the grid with an electroconductive solid zone that are thus obtained.

20 Claims, 8 Drawing Sheets

(51) Int. Cl.
  *C03C 17/00* (2006.01)
  *C03C 17/06* (2006.01)
  *C03C 17/23* (2006.01)
  *H01L 51/52* (2006.01)
  *B05D 1/38* (2006.01)
  *B05D 3/12* (2006.01)
  *B05D 5/00* (2006.01)

(52) U.S. Cl.
  CPC ........ *H01L 51/5203* (2013.01); *H01L 51/5206* (2013.01); *H05K 3/048* (2013.01); *B05D 1/38* (2013.01); *B05D 3/12* (2013.01); *B05D 5/00* (2013.01); *C03C 2218/328* (2013.01); *C03C 2218/34* (2013.01); *H01L 2251/5361* (2013.01); *Y10T 29/49002* (2015.01); *Y10T 428/24273* (2015.01)

(56) References Cited

U.S. PATENT DOCUMENTS

| | | | |
|---|---|---|---|
| 4,649,432 | A | 3/1987 | Watanabe et al. |
| 4,732,456 | A | 3/1988 | Fergason et al. |
| 4,806,922 | A | 2/1989 | McLaughlin et al. |
| 5,280,373 | A | 1/1994 | Ozawa et al. |
| 5,346,770 | A | 9/1994 | Osada et al. |
| 5,667,853 | A | 9/1997 | Fukuyoshi et al. |
| 5,962,115 | A | 10/1999 | Zmelty et al. |
| 6,014,196 | A | 1/2000 | Anzaki et al. |
| 6,040,056 | A | 3/2000 | Anzaki et al. |
| 6,045,896 | A | 4/2000 | Boire et al. |
| 6,414,431 | B1 | 7/2002 | Yu et al. |
| 6,489,045 | B1 | 12/2002 | Araki et al. |
| 7,049,757 | B2 | 5/2006 | Foust et al. |
| 7,161,171 | B2 | 1/2007 | Dahmani et al. |
| 7,172,822 | B2 | 2/2007 | Shibata |
| 2002/0008286 | A1 | 1/2002 | Yamazaki et al. |
| 2003/0049464 | A1 | 3/2003 | Glenn et al. |
| 2003/0162333 | A1 | 8/2003 | Kim et al. |
| 2003/0186064 | A1 | 10/2003 | Murata et al. |
| 2004/0001915 | A1 | 1/2004 | He et al. |
| 2004/0031957 | A1 | 2/2004 | Tyan |
| 2004/0032220 | A1 | 2/2004 | Cok et al. |
| 2004/0081855 | A1 | 4/2004 | Kim et al. |
| 2004/0113146 | A1 | 6/2004 | Dahmani et al. |
| 2004/0149984 | A1 | 8/2004 | Tyan et al. |
| 2004/0150326 | A1* | 8/2004 | Shibata ........................ 313/503 |
| 2004/0245918 | A1 | 12/2004 | Lee |
| 2005/0000564 | A1 | 1/2005 | Sato et al. |
| 2005/0059766 | A1* | 3/2005 | Jones et al. .................... 524/431 |
| 2005/0073228 | A1 | 4/2005 | Tyan et al. |
| 2005/0073251 | A1 | 4/2005 | Kato |
| 2005/0124257 | A1 | 6/2005 | Maeuser |
| 2005/0162071 | A1 | 7/2005 | Lee et al. |
| 2005/0199904 | A1 | 9/2005 | Yamamoto |
| 2005/0264185 | A1 | 12/2005 | Hoffmann |
| 2006/0043886 | A1 | 3/2006 | Lee et al. |
| 2006/0091791 | A1 | 5/2006 | Shin |
| 2006/0124933 | A1 | 6/2006 | Kang |
| 2006/0152833 | A1 | 7/2006 | Halls et al. |
| 2006/0209551 | A1 | 9/2006 | Schwenke et al. |
| 2006/0269786 | A1 | 11/2006 | Shin et al. |
| 2006/0290841 | A1 | 12/2006 | Kwon et al. |
| 2007/0206263 | A1 | 9/2007 | Neuman et al. |
| 2008/0100202 | A1 | 5/2008 | Cok |
| 2010/0072884 | A1 | 3/2010 | Tchakarov et al. |
| 2010/0117523 | A1 | 5/2010 | Tchakarov |
| 2010/0225227 | A1 | 9/2010 | Tchakarov et al. |

FOREIGN PATENT DOCUMENTS

| | | |
|---|---|---|
| EP | 0 238 164 | 9/1987 |
| EP | 0 733 931 | 9/1996 |
| EP | 0 747 330 | 12/1996 |
| EP | 0 847 965 | 6/1998 |
| EP | 1 329 307 | 7/2003 |
| EP | 1 396 676 | 3/2004 |
| EP | 1 403 939 | 3/2004 |
| EP | 1 521 305 | 4/2005 |
| EP | 1 553 153 | 7/2005 |
| EP | 1 693 483 | 8/2006 |
| EP | 1 717 876 | 11/2006 |
| FR | 2 844 136 | 3/2004 |
| JP | 10-100303 | 4/1998 |
| JP | 10-217378 | 8/1998 |
| JP | 11-070610 | 3/1999 |
| JP | 2000-234187 | 8/2000 |
| JP | 2001-243840 | 9/2001 |
| JP | 2002-015623 | 1/2002 |
| JP | 2002-313139 | 10/2002 |
| JP | 2002-313572 | 10/2002 |
| JP | 2003-331654 | 11/2003 |
| JP | 2007-246913 | 9/2007 |
| WO | WO 92/19695 | 11/1992 |
| WO | WO 99/02017 | 1/1999 |
| WO | WO 2004/015739 | 2/2004 |
| WO | WO 2004/057674 | 7/2004 |
| WO | WO 2005/041620 | 5/2005 |
| WO | WO 2005/053053 | 6/2005 |
| WO | WO 2006/013373 | 2/2006 |
| WO | WO 2006/090086 | 8/2006 |
| WO | WO 2007/023237 | 3/2007 |
| WO | WO 2007/042689 | 4/2007 |
| WO | WO 2007/096565 | 8/2007 |
| WO | WO 2008/023124 | 2/2008 |

OTHER PUBLICATIONS

International Preliminary Report on Patentability, including the Written Opinion dated Feb. 18, 2010, as issued for PCT/FR2009/051815, dated May 31, 2011.

Kloeppel, A., et al., "Dependence of the electrical and optical behaviour of ITO-silver-ITO multilayers on the silver properties", Thin Solid Films, Elsevier, vol. 365, No. 1, pp. 139-146, Apr. 1, 2000.

Jung, Yeon Sik, et al., "Effects of thermal treatment on the electrical and optical properties of silver-based indium tin oxide / metal / indium tin oxide structures", Thin Solid Films, Elsevier, vol. 440, No. 1-2, pp. 278-284, Sep. 1, 2003.

International Search Report as issued for PCT/FR2009/051815, dated Feb. 18, 2010.

Adelung, et al., "Strain-controlled growth of nanowires within thin-film cracks", Nature Materials, Nature Publishing Group, vol. 3, Jun. 2004, pp. 375-379.

* cited by examiner

METHOD FOR MANUFACTURING A MASK HAVING SUBMILLIMETRIC APERTURES FOR A SUBMILLIMETRIC ELECTRICALLY CONDUCTIVE GRID, MASK HAVING SUBMILLIMETRIC APERTURES AND SUBMILLIMETRIC ELECTRICALLY CONDUCTIVE GRID

CROSS-REFERENCE TO RELATED APPLICATIONS

This application is the U.S. National Stage of PCT/FR2009/051815, filed Sep. 24, 2009, which in turn claims priority to French Application No. 0856427, filed Sep. 24, 2008. The content of both applications are incorporated herein by reference in their entirety.

FIELD

The present invention relates to a process for manufacturing a mask having submillimetric openings in order to produce a submillimetric electroconductive grid, to such a mask, and to the grid thus obtained.

BACKGROUND

Manufacturing techniques are known that make it possible to obtain micron-sized metal grids. These have the advantage of attaining surface resistances of less than 1 ohm/square while retaining a light transmission ($T_L$) of around 75 to 85%. However, their production process is based on a technique of etching a metal layer via a photolithographic process resulting in a high manufacturing cost that is incompatible with the envisioned applications.

Document U.S. Pat. No. 7,172,822 itself describes the production of an irregular network conductor that is based on the use of a cracked silica sol-gel mask. In the examples carried out, a sol based on water, alcohol and a silica precursor (TEOS) was deposited, the solvent was evaporated and it was annealed at 120° C. for 30 minutes in order to form the 0.4 μm thick cracked sol-gel mask.

Once the OLED device is produced, aluminum wires are connected to the electrodes for the electrical power supply.

FIG. 3 from this document U.S. Pat. No. 7,172,822 reveals the morphology of the silica sol-gel mask. It appears in the form of fine crack lines oriented along a preferred direction, with bifurcations characteristic of the fracture phenomenon of an elastic material. These main crack lines are occasionally joined together by the bifurcations.

The domains between the crack lines are asymmetric with two characteristic dimensions: one parallel to the crack propagation direction between 0.8 and 1 mm, the other perpendicular between 100 and 200 μm.

This process for manufacturing an electrode by cracking of the sol-gel mask admittedly constitutes progress for the manufacture of a network conductor by eliminating, for example, recourse to photolithography (exposure of a resist to radiation/a beam and development), but may still be improved, especially in order to be compatible with industrial requirements (reliability, simplification and/or reduction of the manufacturing steps, reduced cost, etc.).

It can also be observed that this manufacturing process inevitably requires the deposition of a (chemically or physically) modifiable sublayer at the openings in order either to allow a favored adhesion (of metal colloids for example) or else to allow catalyst grafting for metal postgrowth, this sublayer therefore having a functional role in the growth process of the network.

Furthermore, the profile of the cracks is V-shaped due to the fracture mechanics of the elastic material, thus entailing the use of a post-mask process in order to make the metallic network grow starting from colloidal particles located at the base of the V.

Furthermore, both the electrical and/or optical properties of this irregular network electrode and the connection system and/or other connected functions can be improved.

SUMMARY

The present invention therefore aims to overcome the drawbacks of the prior art processes by proposing a process for manufacturing an electroconductive grid having at least one submillimetric characteristic dimension (width of strands A' and/or spacing between strands B') and in electrical contact with at least one electric power supply component.

This process should be simple, economical, in particular free of (photo)lithography step(s), flexible (suitable regardless of the desired connection system design), and be able to be carried out even over large surface areas.

The optical and/or electrical conductivity properties of the grid should moreover be at least comparable to those of the prior art.

For this purpose, a first subject of the invention is a process for manufacturing a mask having submillimetric openings, in particular micron-scale openings (at least for the width of the openings), for a submillimetric electroconductive grid, mask on a main face of a substrate, in particular that is transparent and/or flat, by deposition of a liquid masking layer as a given solution and drying, in which process:

for said masking layer, a solution of colloidal nanoparticles stabilized and dispersed in a solvent is deposited, the nanoparticles having a given glass transition temperature $T_g$;

said drying of the masking layer, known as the first masking layer, is carried out at a temperature below said temperature $T_g$ until a mask having a two-dimensional network of submillimetric openings, referred to as a network mask, is obtained with substantially straight mask zone edges (through the entire thickness), the mask being on a zone referred to as a network mask zone.

The process comprises, in addition, the formation of a zone free of masking on said face by mechanical and/or optical removal of at least one peripheral portion of the network mask zone.

The mask having a network of openings according to the invention and its manufacturing method according to the invention have a certain number of advantages described below. The benefit of forming the free zone will subsequently be described.

By virtue of the process according to the invention, a mesh of openings is formed, which openings may be distributed over the entire masking surface and make it possible to obtain isotropic properties.

The network of openings has substantially more interconnections than the cracked silica sol-gel mask of the prior art.

The network mask has a random aperiodic structure in at least one characteristic direction of the network (therefore parallel to the surface of the substrate), or even in two (all) directions.

In order to obtain substantially straight edges, it is necessary to both:
- choose particles of limited size, therefore nanoparticles, in order to promote their dispersion, preferably with at least one characteristic (mean) dimension, for example the mean diameter, between 10 and 300 nm, or even between 50 and 150 nm; and
- stabilize the nanoparticles in the solvent (especially by treatment via surface charges, for example via a surfactant, by control of the pH), to prevent them from agglomerating together, from precipitating and/or from falling due to gravity.

In addition, the concentration of the nanoparticles is adjusted, preferably between 5%, or even 10% and 60% by weight, more preferably still between 20% and 40%. The addition of binder is avoided (or it is added in a small enough amount so as not to influence the mask).

Drying causes a contraction of the masking layer and friction of the nanoparticles at the surface resulting in a tensile stress in the layer which, via relaxation, forms the openings.

Drying may result, in one step, in the elimination of the solvent and in the formation of the openings.

After drying, a stack of nanoparticles is thus obtained, in the form of clusters of variable size that are separated by the openings that are themselves of variable size. The nanoparticles remain discernible even if they may aggregate. The nanoparticles are not melted to form a continuous layer.

The drying is carried out at a temperature below the glass transition temperature for the creation of the network of openings. Indeed, it has been observed that above this glass transition temperature, a continuous layer or at the very least a layer without cracks through the entire thickness was formed.

Thus, a weakly adherent layer simply composed of a stack of (hard), preferably spherical nanoparticles is deposited on the substrate. These hard nanoparticles do not establish strong chemical bonds, either between themselves or with the surface of the substrate. The cohesion of the layer is provided all the same by weak forces, of the van der Waals forces or electrostatic forces type.

The mask obtained is capable of easily being eliminated using cold or warm pure water, in particular with an aqueous solvent, without requiring highly basic solutions or potentially polluting organic compounds.

By choosing a high enough $T_g$ for the nanoparticles of the solution, the drying step (and preferably also the deposition step) may be carried out (substantially) at a temperature below 50° C., preferably at ambient temperature, typically between 20° and 25° C. Thus, unlike the sol-gel mask, annealing is not necessary.

The difference between the given glass transition temperature $T_g$ of the particles of the solution and the drying temperature preferably being greater than 10° C., or even 20° C.

The drying step of the masking layer may be carried out substantially at atmospheric pressure rather than drying under vacuum for example.

It is possible to modify the drying parameters (control parameters), especially the degree of humidity and the drying rate, in order to adjust the mean distance between the openings B (otherwise known as width of mask zone), the average size of the openings A (otherwise known as distance between neighboring mask zone), and/or the B/A ratio.

The higher the humidity is (all things otherwise being equal), the lower A is.

The higher the temperature is (all things otherwise being equal), the higher B is.

It is possible to deposit a solution (aqueous or non-aqueous) of colloids via a standard liquid technique.

As wet techniques, mention is made of:
- spin coating;
- curtain coating;
- dip coating;
- spray coating; and
- flow coating.

In a first embodiment, the solution of colloids comprises polymeric nanoparticles, preferably with a solvent that is water-based, or even entirely aqueous.

For example, acrylic copolymers, polystyrenes, poly (meth)acrylates, polyesters or blends thereof are chosen.

The masking layer (before drying) may thus be essentially composed of a stack of colloidal particles (therefore nanoparticles of a material that is insoluble in the solvent) that are discernible and in particular are polymeric. The polymeric nanoparticles are composed of a solid, water-insoluble polymer.

The expression "essentially composed" is understood to mean that the masking layer may optionally comprise other compounds, as traces, which do not have an influence on the properties of the mask (formation of the network, easy removal, etc.).

The colloidal aqueous solution is preferably composed of water and of polymeric colloidal particles, to the exclusion therefore of any other chemical agent (such as, for example, pigments, binders, plasticizers, etc.). Likewise, the colloidal aqueous dispersion is preferably the only compound used to form the mask.

Unlike a silica sol-gel, the solution is naturally stable, with nanoparticles already formed. The solution preferably contains no (or a negligible amount of) reactive element of polymer precursor type.

The mask (after drying) may thus be essentially composed of a stack of nanoparticles, preferably polymeric, discernible nanoparticles. The polymeric nanoparticles are composed of a solid, water-insoluble polymer.

The solution may comprise, alternatively or cumulatively, inorganic nanoparticles, preferably of silica, alumina or iron oxide.

Furthermore, due to the nature of the masking layer, it is possible, in addition, to selectively remove a portion of the network mask without damaging it or damaging the subjacent surface, this being done by the optical and/or mechanical means which are mild and simple means.

The material of the network mask has a mechanical strength that is low enough for it to be removed without damaging the subjacent surface, but remains strong enough to withstand the deposition of the electroconductive material for the grid.

Such a removal of the network mask, preferably which is automated, may be carried out:
- by mechanical action, in particular by blowing (focused airflow, etc.), by rubbing with a non-abrasive element (of the felt, fabric, eraser type), by cutting with a cutting element (a blade, etc.);
- and/or by sublimation, by a laser-type means.

It is possible to choose the type of removal as a function of the desired resolution, and of the effect on the edges of the mask remaining in contact with the removal means.

In one embodiment, it is possible to carry out a liquid deposition of the masking solution over the entire face of the substrate, which is simpler to do, and to partially remove the network mask in particular:
- at least along one edge of the network mask (preferably close to the edge of the substrate) in order to create at least one solid strip (for the connection system and/or for other electrical functions);

along two edges of the network mask in order to form two solid strips opposite one another or on two adjacent edges; and to provide a (complete) outline of the network mask in particular in order to create a solid strip over the entire perimeter (rectangular frame, ring, etc.).

Via partial removal, one or more zones are thus prepared that are ready to receive an electroconductive deposition as a solid layer. It is thus possible to form, in one go, the grid and one or more connection system elements and/or elements of other electrical functionality. In the present invention, the expression "connection system zone" is understood to mean both a current feed zone when the grid is used as an electrode or as a heating grid, and a zone connected to a ground, when the grid is used as electromagnetic shielding.

It is thus possible to connect (by welding, bonding, by pressure) the power supply wires or any other connection element, into the connection system zone or zones. This solution is preferable to the direct connection of the wires to the grid as proposed in the prior art document U.S. Pat. No. 7,172,822 for which the electrical connection is not reliable (risk of poor electrical contact).

The formation of contiguous conductive solid zone(s) thus limits risks of poor electrical contact without increasing the cost or the manufacturing time of the targeted device.

Naturally, it is possible, in addition, to choose the design of the "connection system" to order, by delimiting the deposition zone or zones for the grid and the zone or zones for the solid conductor (electrical power supply).

It is possible to make provision to form a mark (alignment mark for example), a decorative element, an identification element, a logo or a trademark by partial removal.

The surface for the deposition of the masking layer is film-forming in particular preferably hydrophilic if the solvent is aqueous.

The term "hydrophilic" is understood to mean a surface on which the contact angle of a drop of water having a diameter of 1 mm is less than 15°, or even less than 10°.

This is the surface of the substrate, which is preferably transparent: glass, plastic (polycarbonate for example), sapphire or quartz, or of an optionally functional added sublayer: hydrophilic layer (layer of silica, for example on plastic) and/or barrier layer to alkali metals and/or adhesion-promoting layer of the grid material, and/or (transparent) electroconductive layer, and/or colored or opaque decorative layer and/or where appropriate etch-stop layer.

The process for manufacturing the electrode described in document U.S. Pat. No. 7,172,822 inevitably requires the deposition of a (chemically or physically) modifiable sublayer at the cracks in order either to allow a favored adhesion (of metal colloids for example) as already indicated, in order either to allow catalyst grafting for metal postgrowth, this sublayer therefore having a functional role in the growth process of the network.

The sublayer according to the invention is not necessarily a growth layer for an electrolytic deposition of the grid material.

Between the masking layer and the substrate there may be several sublayers.

The substrate according to the invention may thus comprise a sublayer which is a base layer, therefore the layer closest to the substrate, which is a continuous, alkali-metal barrier layer.

Such a base layer protects the grid material from any pollution (pollution which may lead to mechanical defects such as delaminations), in the case of an electroconductive deposition (to form an electrode in particular), and additionally preserves its electrical conductivity.

The base layer is robust, quick and easy to deposit according to various techniques. It can be deposited, for example, by a pyrrolysis technique, especially or chemical vapor deposition CVD. This technique is advantageous for the invention since suitable adjustments of the deposition parameters make it possible to obtain a very dense layer for a reinforced barrier.

The base layer may optionally be doped with aluminum and/or boron to render its deposition under vacuum more stable. The base layer (a single layer or multilayer, optionally doped) may have a thickness between 10 and 150 nm, more preferably still between 15 and 50 nm.

The base layer may preferably be:
based on silicon oxide, silicon oxycarbide, a layer of general formula SiOC;
based on silicon nitride, silicon oxynitride, silicon oxycarbonitride, a layer of general formula SiNOC, especially SiN, in particular $Si_3N_4$.

Very particularly, a base layer (predominantly) made of doped or undoped silicon nitride $Si_3N_4$ may be preferred. Silicon nitride is deposited very rapidly and forms an excellent barrier to alkali metals.

As a layer that promotes the adhesion of the metal grid material (silver, gold), especially onto glass, it is possible to choose a layer based on NiCr, Ti, Nb, Al, a single or mixed, doped or undoped metal oxide (ITO, etc.), a layer for example having a thickness less than or equal to 5 nm.

When the substrate is hydrophobic, it is possible to add a hydrophilic layer such as a silica layer.

The chosen glass substrate is generally glazing, such as a flat or curved, single or multiple (double, triple, etc.) glazing, toughened or annealed glazing, colorless or tinted glazing, the thickness of which is in particular between 1 and 19 mm, more particularly between 2 and 10 mm, or even between 3 and 6 mm.

It is possible to clean the network of openings using an atmospheric pressure plasma source.

The invention also proposes a substrate bearing on a main face:
a mask having a network of submillimetric openings, composed of (preferably essentially consisting of) a stack of discernible, preferably polymeric, in particular substantially spherical nanoparticles, for example having a glass transition temperature above 50° C., with mask areas having substantially straight edges (through the entire thickness) mask on a zone known as the network mask zone, the network mask preferably being on a hydrophilic surface;
at least one zone free of masking (for the connection system), adjacent to and in contact with the network mask.

The thickness of the masking layer (where appropriate after drying, of the thickness of the network mask) is preferably between 2 and 100 microns, in particular between 5 and 50 microns, or even between 10 and 30 microns.

Owing to this manufacturing process according to the invention, it is possible to obtain, at a lower cost, a mask composed of random (shape and/or size), aperiodic patterns of suitable characteristic dimensions:
(mean) width of the openings of the network A is micronsized, or even nanoscale, in particular between a few hundreds of nanometers to a few tens of microns, especially between 200 nm and 50 µm;
(mean) size of pattern B (therefore size between adjacent openings) is millimetric or even submillimetric, especially between 5 to 800 µm, or even 100 to 250 µm;

B/A ratio is adjustable, in particular, as a function of the nature of the particles, especially between 7 and 20 or even 40;

difference between the maximum width of the openings and the minimum width of the openings is less than 4, or even less than or equal to 2, in a given region of the mask, or even over the majority or the whole of the surface;

difference between the maximum pattern dimension and the minimum pattern dimension is less than 4, or even less than or equal to 2, in a given region of the mask, or even over the majority or even over the whole of the surface;

the degree of open pattern (non-through or "blind" opening), is less than 5%, or even less than or equal to 2%, in a given region of the mask, or even over the majority or the whole of the surface, therefore with limited or even almost zero network rupture, which, is optionally reduced and can be eliminated by etching of the network;

for a given pattern, the majority or even all of the patterns in a given region or over the whole of the surface, the difference between the largest dimension that is characteristic of the pattern and the smallest dimension that is characteristic of the pattern is less than 2, in order to strengthen the isotropy; and for the majority or even all of the segments of the network, the edges are constantly spaced, parallel, in particular on a scale of 10 μm (for example, observed with an optical microscope with a magnification of 200).

The width A may be, for example, between 1 and 20 μm, or even between 1 and 10 μm, and B may be between 50 and 200 μm.

This makes it possible to subsequently produce a grid defined by a mean strand width A' that is substantially identical to the width of the openings A and a (mean) space between the strands B' that is substantially identical to the space between the openings (the dimension of a mesh) B.

In particular, the sizes of the strands A' may preferably be between a few tens of microns to a few hundreds of nanometers. The B'/A' ratio may be chosen between 7 and 20, or even 30 to 40.

The patterns delimited by the openings are of diverse shapes, typically with three, four or five sides, for example predominantly with four sides, and/or of diverse sizes, distributed randomly and aperiodically.

For the majority or all of the patterns, the angle between two adjacent sides of a pattern may be between 60° and 110°, especially between 80° and 100°.

In one configuration, there is obtained a main network with openings (optionally approximately parallel) and a secondary network of openings (optionally approximately perpendicular to the parallel network), the location and the distance of which are random. The secondary openings have a width, for example, smaller than the main openings.

It is possible to modify other control parameters chosen from the friction coefficient between the compacted colloids, in particular by nanotexturing of the substrate and the surface of the substrate, the size of the nanoparticles and the initial nanoparticle concentration, the nature of the solvent and the thickness that is dependent on the deposition technique, in order to adjust B, A and/or the B/A ratio.

The thickness of the network mask may submicron-sized up to several tens of microns. The greater the thickness of the masking layer is, the larger A (respectively B) is.

The higher the concentration is (all things otherwise being equal), the lower B/A is.

The edges of the openings are substantially straight, that is to say along a mid-plane between 80° and 100° relative to the surface (if the surface is curved, relative to the tangential plane), or even between 85° and 95°.

Moreover, the characteristic dimensions of the grids made by photolithography, generally of regular and periodic shape (square, rectangular), form networks of 20 to 30 μm wide metal strands spaced, for example, 300 μm apart, which are the source, when they are illuminated by a point light source, of diffraction patterns. And it would be even more difficult and expensive to make grids with random patterns. Each pattern to be produced would require a specific mask.

This manufacturing technique of the prior art furthermore has a resolution limit of around a few tens of μm, leaving the patterns esthetically visible.

The network mask according to the invention therefore makes it possible to envision at lower cost, irregular grids of other shapes, of any size.

According to the invention, the dimensions of the strands may be very small (a few μm) and the thicknesses of the strands may also be very small (for example 500 nm). Therefore, the grids have a low electrical resistance (<2 ohm) and a high light transmission (>80%) and are almost invisible.

The mask makes it possible to manufacture an irregular grid with a real meshing or paving, random grid in at least one (grid) direction, and not a simple network conductor as proposed in document U.S. Pat. No. 7,172,822.

The invention therefore also relates to the manufacture of a submillimetric electroconductive grid on a main face of a substrate successively comprising:

the deposition of an electroconductive material,
(directly or indirectly) on the face, through the openings of the already defined network mask, until a fraction of the depth of the openings is filled
and on the zone free of masking,
the removal of the network mask revealing the submillimetric electroconductive grid.

This grid may form a (semi)transparent electrode of an electrically controllable system and/or a heating grid and/or an electromagnetic shielding grid.

The arrangement of the strands (in other words the network of strands, the strands delimiting meshes) may then be substantially the replica of that of the network of openings.

Owing to the straight edges of the network mask (that result in no or little deposition along the edges) it is thus possible to remove the coated mask without damaging the grid.

For the sake of simplicity, directional grid material deposition techniques may be favored. The deposition may be carried out both through the openings and over the mask.

Preferably, the removal is carried out via a liquid route, by a solvent that is inert for the grid, for example with water, acetone or alcohol (optionally at high temperature and/or assisted by ultrasound).

The deposition of the electroconductive material may be an atmospheric pressure deposition, in particular via plasma, a deposition under vacuum, by sputtering or by evaporation.

It is thus possible to then choose one or more deposition techniques that can be carried out at ambient temperature and/or that are simple (in particular simpler than a catalytic deposition that inevitably requires a catalyst) and/or that give dense deposits.

It is possible to deposit an electrically conductive material onto the electroconductive material via electrolysis.

The deposition may thus be optionally completed by an electrolytic recharge using an electrode made of Ag, Cu, Au or another usable metal with high conductivity.

When the substrate is insulating, the electrolytic deposition may be carried out either before or after removal of the mask.

By varying the B'/A' ratio (space between the strands B' over the width of the strands A'), haze values between 1 and 20% are obtained for the grid.

The invention also relates to a substrate, in particular a transparent substrate, bearing on a main face a submillimetric irregular grid, that is to say a two-dimensional meshed network of strands with (closed), in particular random, meshes in at least one direction of the grid (therefore parallel to the substrate).

The grid is made of an electroconductive material and the face also bears a solid electroconductive zone adjacent to and in contact with the grid and made of said electroconductive material.

This grid and the solid zone may especially be formed from the manufacturing process that has already been defined previously.

The solid electroconductive zone may be a wide, especially rectangular, strip.

The grid may have one or more of the following characteristics:
- a ratio of the (mean) space between the strands B' to the submillimetric (mean) width of the strands A' of between 7 and 40;
- the patterns of the grid are random (aperiodic) and of diverse shape and/or size;
- meshes delimited by the strands have three and/or four and/or five sides, for example mostly four sides;
- the grid has an aperiodic (or random) structure in at least one direction, preferably in two directions;
- for most, or even all, of the meshes in a given region or over the entire surface, the difference between the largest characteristic dimension of the mesh and the smallest characteristic dimension of the mesh less than 2;
- for most, or even all, of the meshes, the angle between two adjacent sides of one mesh may be between 60° and 110°, especially between 80° and 100°;
- the difference between the maximum width of the strands and the minimum width of the strands is less than 4, or even less than or equal to 2, in a given grid region, or even over the majority or all of the surface;
- the difference between the maximum mesh dimension (space between strands forming a mesh) and the minimum mesh dimension is less than 4, or even less than or equal to 2, in a given grid region, or even over the majority or all of the surface;
- the amount of non-sealed mesh and/or of cut ("blind") strand segment is less than 5%, or even less than or equal to 2%, in a given grid region, or even over the majority or all of the surface, i.e. a limited or even almost zero network rupture;
- for the most part, the strand edges are constantly spaced, in particular substantially linear, parallel, on a scale of 10 µm (for example observed with an optical microscope with a magnification of 200).

The grid according to the invention may have isotropic electrical properties.

Unlike the network conductor of the prior art with a favored direction, the electroconductive irregular grid according to the invention may not diffract a point light source.

The thickness of the strands may be substantially constant in thickness or be wider at the base.

The electroconductive grid according to the invention may comprise a main network with strands (that are optionally approximately parallel) and a secondary network of strands (that are optionally approximately perpendicular to the parallel network).

The electroconductive grid according to the invention may be deposited over at least one surface portion of the substrate, especially a substrate having a glass function, made of a plastic or an inorganic material, as already indicated.

The electroconductive grid according to the invention may be deposited onto a sublayer that is a hydrophilic layer and/or a layer that promotes adhesion and/or a barrier layer and/or a decorative layer as already indicated.

The electroconductive grid according to the invention may have a sheet resistance between 0.1 and 30 ohm/square. Advantageously, the electroconductive grid according to the invention may have a sheet resistance less than or equal to 5 ohm/square, or even less than or equal to 1 ohm/square, or even 0.5 ohm/square, especially for a grid thickness greater than or equal to 1 µm, and preferably less than 10 µm or even less than or equal to 5 µm.

The B'/A' ratio may be different, for example at least double, in a first grid region and in a second grid region.

The first and second regions may be of different or equal shape and/or of different or equal size.

The light transmission of the network depends on the B'/A' ratio of the mean distance between the strands B' to the mean width of the strands A'.

Preferably, the B'/A' ratio is between 5 and 15, more preferably still around 10, to easily retain the transparency and facilitate the manufacture. For example, B' and A' are respectively equal to around 50 µm and 5 µm.

In particular, a mean strand width A' is chosen between 100 nm and 30 µm, preferably less than or equal to 10 µm, or even 5 µm in order to limit their visibility and greater than or equal to 1 µm to facilitate the manufacture and to easily retain a high conductivity and a transparency.

In particular, it is additionally possible to choose a mean distance between strands B' that is greater than A', between 5 µm and 300 µm, or even between 20 and 100 µm, to easily retain the transparency.

The thickness of the strands may be between 100 nm and 5 µm, especially micron-sized, more preferably still from 0.5 to 3 µm to easily retain a transparency and a high conductivity.

The grid according to the invention may be over a large surface area, for example a surface area greater than or equal to 0.02 $m^2$, or even greater than or equal to 0.5 $m^2$ or to 1 $m^2$.

The substrate may be flat or curved (for example a tube for a coaxial lamp), and additionally rigid, flexible or semi-flexible.

The main faces of the flat substrate may be rectangular, square or even of any other shape (round, oval, polygonal, etc.).

The substrate may be of a large size, for example having a surface area greater than 0.02 $m^2$, or even 0.5 $m^2$ or 1 $m^2$.

The substrate may be preferably substantially transparent, inorganic or made of a plastic such as polycarbonate PC or polymethyl methacrylate PMMA, or else PET, polyvinyl butyral PVB, polyurethane PU, polytetrafluoroethylene PTFE, etc.

The substrate is preferably glass, especially made of soda-lime-silica glass. The substrate may be tinted.

The substrate may have a glass function when it is substantially transparent, and when it is based on inorganic materials (for example, a soda-lime-silica glass) or when it is based on a plastic (such as polycarbonate PC or polymethyl methacrylate PMMA).

In order to transmit UV radiation, the substrate may preferably be chosen from quartz, silica, magnesium fluoride (MgF$_2$), calcium fluoride (CaF$_2$), a borosilicate glass or a glass with less than 0.05% of Fe$_2$O$_3$.

To give examples, for thicknesses of 3 mm:
- magnesium or calcium fluorides transmit more than 80%, or even 90%, over the entire range of UV bands, that is to say UVA (between 315 and 380 nm), UVB (between 280 and 315 nm), UVC (between 200 and 280 nm) and VUV (between about 10 and 200 nm);
- quartz and certain high-purity silicas transmit more than 80%, or even 90%, over the entire range of UVA, UVB and UVC bands;
- borosilicate glass, such as Borofloat from Schott, transmits more than 70% over the entire UVA band; and
- soda-lime-silica glass with less than 0.05% Fe(III) or Fe$_2$O$_3$, especially the glass Diamant from Saint-Gobain, the glass Optiwhite from Pilkington, and the glass B270 from Schott, transmit more than 70% or even 80% over the entire UVA band.

However, a soda-lime-silica glass, such as the glass Planilux sold by Saint-Gobain, has a transmission of more than 80% above 360 nm, which may be sufficient for certain constructions and certain applications.

The substrate may also be chosen for being transparent in a given infrared band, for example between 1 µm and 5 µm. For example, it may be sapphire.

The (overall) light transmission of the substrate coated with the grid may be greater than or equal to 50%, more preferably still greater than or equal to 70%, especially is between 70% and 86%.

The (overall) transmission, in a given IR band, for example between 1 µm and 5 µm, of the substrate coated with the grid may be greater than or equal to 50%, more preferably still greater than or equal to 70%, especially is between 70% and 86%. The targeted applications are for example heated glazing with an infrared vision system, in particular for night vision.

The (overall) transmission, in a given UV band, of the substrate coated with the grid may be greater than or equal to 50%, more preferably still greater than or equal to 70%, especially is between 70% and 86%.

The grid according to the invention may be used, in particular, as a lower electrode (the closest to the substrate) for an organic light-emitting device (OLED) especially a bottom emission OLED or a bottom and top emission OLED.

A multiple laminated glazing (lamination interlayer of EVA, PU, PVB, etc. type) may incorporate a substrate bearing the grid according to the invention with the connection system zone being adjacent to and in contact with the grid.

According to yet another of its aspects, the invention targets the use of a grid with the connection system zone as described previously as:
- active layer (single-layer or multilayer electrode) in an electrochemical and/or electrically controllable device having variable optical and/or energy properties, for example a liquid crystal device or a photovoltaic device, or else an organic or inorganic light-emitting device (TFEL, etc.), a lamp especially a flat lamp, an optionally flat UV lamp;
- heating grid of a heating device, for a vehicle (windshield, rear window, porthole, etc.), for electrical goods of the radiator, towel warmer or refrigerated cabinet type, for a defrosting, anti-condensation, anti-fogging, etc. action;
- an electromagnetic shielding grid;
- or any other device requiring an (optionally (semi)-transparent) electroconductive grid in contact with an adjacent connection system zone.

As a reminder, in electrochromic systems, there are "all solid" electrochromic systems (the term "all solid" being defined, within the context of the invention, in respect of the multilayer stacks for which all the layers are of inorganic nature) or "all polymer" electrochromic systems (the term "all polymer" being defined, within the context of the invention, in respect of the multilayer stacks for which all the layers are of organic nature), or else mixed or hybrid electrochromic systems (in which the layers of the stack are of organic nature and inorganic nature) or else liquid-crystal or viologen systems.

As a reminder, discharge lamps comprise phosphor(s) as active element. Flat lamps in particular comprise two glass substrates held slightly apart, generally separated by less than a few millimeters, and hermetically sealed so as to contain a gas under reduced pressure, in which an electrical discharge produces radiation generally in the ultraviolet range, which excites a phosphor, which then emits visible light.

Flat UV lamps may have the same structure, naturally for at least one of the walls a material is chosen that transmits UV (as already described). The UV radiation is directly produced by the plasma gas and/or by a suitable additional phosphor.

As examples of flat UV lamps, reference may be made to patents WO 2006/090086, WO 2007/042689, WO 2007/023237 and WO 2008/023124 which are incorporated by reference.

The discharge between the electrodes (anode and cathode) may be non-coplanar ("plane-plane"), with anode and cathode respectively associated with the substrates, via a face or in the thickness, (both internal or external, one internal and the other external, at least one in the substrate, etc.), for example as described in patents WO 2004/015739, WO 2006/090086 or WO 2008/023124 which are incorporated by reference.

In UV lamps and flat lamps, the discharge between the electrodes (anode and cathode) may be coplanar (anode and cathode in one and the same plane, on one and the same substrate) as described in patent WO 2007/023237 which is incorporated by reference.

It may be another type of lighting system, namely an inorganic light-emitting device, the active element being an inorganic light-emitting layer based on a doped phosphor, for example chosen from: ZnS:Cu,Cl; ZnS:Cu,Al; ZnS:Cu,Cl, Mn or else CaS or SrS. This layer is preferably separated from the electrodes by insulating layers. Examples of such glazing are described in document EP 1 553 153 A (with the materials, for example, in table 6).

Liquid crystal glazing may be used as variable light scattering glazing. It is based on the use of a film based on a polymer material and placed between two conductive layers, droplets of liquid crystals, especially nematic liquid crystals having positive dielectric anisotropy, being dispersed in said material. When a voltage is applied to the film, the liquid crystals orient in a preferred direction, thereby allowing vision. With no voltage applied, the crystals not being aligned, the film becomes diffusing and prevents vision. Examples of such films are described, in particular, in European patent EP 0 238 164 and United States patents U.S. Pat. No. 4,435,047, U.S. Pat. No. 4,806,922 and U.S. Pat. No. 4,732,456. This type of film, once laminated and incorporated between two glass substrates, is sold by SAINT-GOBAIN GLASS under the brand name Privalite.

In fact, it is possible to use any device based on liquid crystals known under the terms "NCAP" (nematic curvilinearly aligned phases) or "PDLL" (polymer dispersed liquid crystal) or "CLC" (cholesteric liquid crystal).

The latter may also contain dichroic dyes, in particular in solution in the droplets of liquid crystals. It is then possible to jointly modulate the light scattering and the light absorption of the systems.

It is also possible to use, for example, gels based on cholesteric liquid crystals containing a small amount of crosslinked polymer, such as those described in patent WO 92/19695.

The invention also relates to the incorporation of a grid such as obtained from the production of the mask described previously in glazing, operating in transmission.

The term "glazing" should be understood in the broad sense and encompasses any essentially transparent material, having a glass function, that is made of glass and/or of a polymer material (such as polycarbonate PC or polymethyl methacrylate PMMA). The carrier substrates and/or counter-substrates, that is to say the substrates flanking the active system, may be rigid, flexible or semi-flexible.

The invention also relates to the various applications that may be found for these devices, glazing or mirrors: they may be used for producing architectural glazing, especially exterior glazing, internal partitions or glazed doors. They may also be used for windows, roofs or internal partitions of modes of transport such as trains, planes, cars, boats and worksite vehicles. They may also be used for display screens such as projection screens, television or computer screens, touch-sensitive screens, illuminating surfaces and heated glazing.

BRIEF DESCRIPTION OF THE DRAWINGS

The invention will now be described in greater detail with the aid of non-limiting examples and figures.

DETAILED DESCRIPTION

Manufacture of the Network Mask

A simple emulsion of colloidal particles based on an acrylic copolymer that are stabilized in water at a concentration of 40 wt %, a pH of 5.1 and with a viscosity equal to 15 mPa·s is deposited by a wet route technique, by spin coating, onto a main face of a substrate 1 having a glass function, for example which is flat and inorganic. The colloidal particles have a characteristic dimension between 80 and 100 nm and are sold by DSM under the trademark Neocryl XK 52® and have a $T_g$ equal to 115° C.

Drying of the layer incorporating the colloidal particles is then carried out so as to evaporate the solvent and form the openings. This drying may be carried out by any suitable process and at a temperature below the $T_g$ (hot air drying, etc.), for example at ambient temperature.

Figure 1:
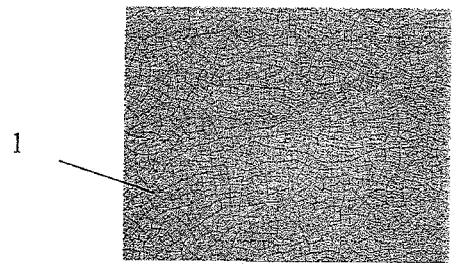
FIGS. 1 to 2d represent masks used in the process according to the invention.
Figure 2:
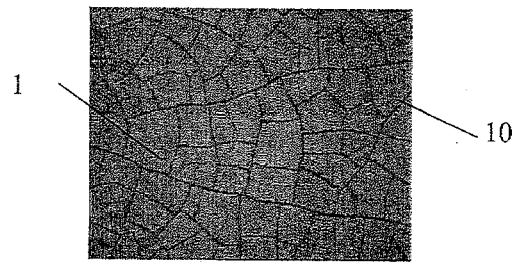

During this drying step, the system rearranges itself and forms a network mask 1 comprising a network of openings 10. It depicts patterns, exemplary embodiments of which are represented in FIGS. 1 and 2 (400 μm×500 μm views).

A stable network mask 1 is obtained without resorting to annealing, having a structure characterized by the (mean) width of the opening subsequently referred to as A (in fact, the size of the strand A') and the (mean) space between the openings subsequently referred to as B. This stabilized mask will subsequently be defined by the ratio B/A.

More specifically, it is a two-dimensional network of openings, which is "meshed" with little rupture of the "meshes" or rupture of interconnections (few blocked opening or blind opening segments).

Figure 2A:
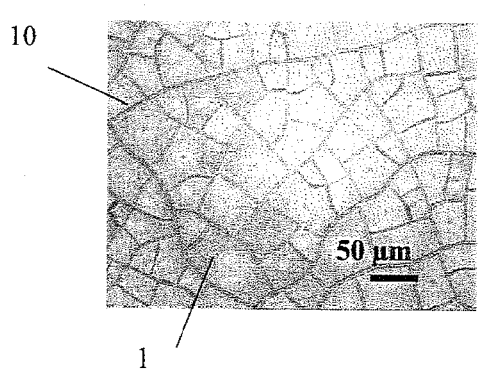
Figure 2B:
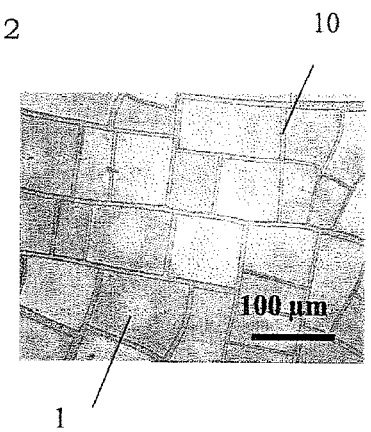

The influence of the drying temperature was evaluated. Drying at 10° C. under 20% RH results in an 80 μm mesh (cf. FIG. 2a), whereas drying at 30° C. under 20% RH results in a 130 μm mesh (cf. FIG. 2b).

The influence of the drying conditions, especially the degree of humidity, was evaluated. The layer based on XK52 is this time deposited by flow coating which gives a variation in thickness between the bottom and the top of the sample (from 10 μm to 20 μm) resulting in a variation of the mesh size. The higher the humidity is, the smaller B is.

| Drying | Position | Mesh size B (μm) |
|---|---|---|
| 10° C. - 20% humidity | top | 65 |
| 10° C. - 20% humidity | bottom | 80 |
| 10° C. - 80% humidity | top | 45 |
| 10° C. - 80% humidity | bottom | 30 |
| 30° C. - 20% humidity | top | 60 |
| 30° C. - 20% humidity | bottom | 130 |
| 30° C. - 80% humidity | top | 20 |
| 30° C. - 80% humidity | bottom | 45 |

This B/A ratio is also modified by adjusting, for example, the friction coefficient between the compacted colloids and the surface of the substrate, or else the size of the nanoparticles, or even also the evaporation rate, or the initial particle concentration, or the nature of the solvent, or the thickness that is dependent on the deposition technique, etc.

In order to illustrate these various possibilities, an experimental design is given below with 2 concentrations of the colloid solution ($C_0$ and $0.5 \times C_0$) and various thicknesses deposited by adjusting the ascent rate of the dip coater. It is observed that it is possible to change the B/A ratio by changing the concentration and/or the drying rate. The results are given in the following table:

| Weight concentration | Ascent rate of the dip coater (cm/min) | B: space between the openings (μm) | A: width of the openings (μm) | B/A ratio |
|---|---|---|---|---|
| 20% | 5 | 25 | 3 | 8.4 |
| 20% | 10 | 7 | 1 | 7 |
| 20% | 30 | 8 | 1 | 8 |
| 20% | 60 | 13 | 1.5 | 8.6 |
| 40% | 5 | 50 | 4 | 12.5 |
| 40% | 10 | 40 | 3.5 | 11.4 |
| 40% | 30 | 22 | 2 | 11 |
| 40% | 60 | 25 | 2.2 | 11.4 |

The colloid solution was deposited at the concentration of $C_0=40\%$ by using film-drawers of various thicknesses. These experiments show that the size of the openings and the distance between the openings can be varied by adjusting the initial thickness of the colloid layer.

| Thickness deposited by the film-drawer (μm) | Weight % | B: space between the openings (μm) | A: width of the openings (μm) | B/A ratio |
|---|---|---|---|---|
| 30 | 40 | 20 | 2 | 10 |
| 60 | 40 | 55 | 5 | 11 |
| 90 | 40 | 80 | 7 | 11.4 |
| 120 | 40 | 110 | 10 | 11.1 |
| 180 | 40 | 200 | 18 | 11.1 |
| 250 | 40 | 350 | 30 | 11.6 |

Finally, the surface roughness of the substrate was modified by etching, with atmospheric plasma, the surface of the glass via a mask of Ag nodules. This roughness is of the order of magnitude of the size of the contact zones with the colloids which increases the friction coefficient of these colloids with the substrate. The following table shows the effect of changing the friction coefficient on the B/A ratio and the morphology of the mask. It appears that smaller mesh sizes at an identical initial thickness and a B/A ratio which increases are obtained.

| Nanotexturing treatment | Ascent rate of the dip coater (cm/min) | B: space between the openings (μm) | A: width of the openings (μm) | B/A ratio |
|---|---|---|---|---|
| Yes | 5 | 38 | 2 | 19 |
| Yes | 10 | 30 | 1.75 | 17.2 |
| Yes | 30 | 17 | 1 | 17 |
| Yes | 60 | 19 | 1 | 17.4 |
| Reference | 5 | 50 | 4 | 12.5 |
| Reference | 10 | 40 | 3.5 | 11.4 |
| Reference | 30 | 22 | 2 | 11 |
| Reference | 60 | 25 | 2.2 | 11.4 |

In another exemplary embodiment, the dimensional parameters of the network of openings obtained by spin coating of one and the same emulsion containing the colloidal particles described previously are given below. The various rotational speeds of the spin-coating device modify the structure of the mask.

| Rotational speed (rpm) | B: space between the openings (μm) | A: width of the openings (μm) | B/A ratio |
|---|---|---|---|
| 200 | 40 | 2 | 20 |
| 400 | 30 | 2 | 15 |
| 700 | 20 | 1 | 20 |
| 1000 | 10 | 0.5 | 20 |

Figure 5:
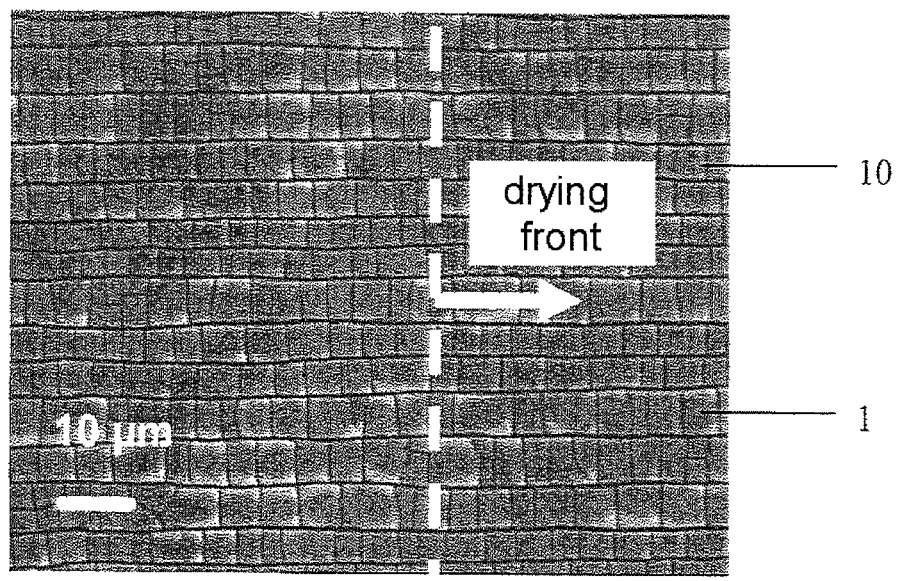
FIGS. 5 and 6 represent masks with different drying fronts.
Figure 6:
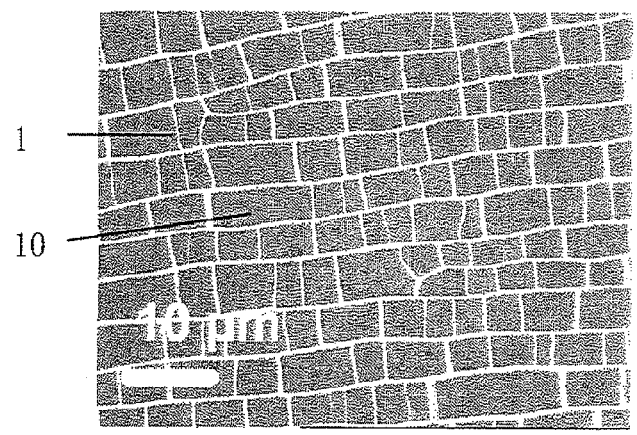

The effect of the propagation (cf. FIGS. 5 and 6) of a drying front on the morphology of the mask was studied. The presence of a drying front makes it possible to create a network of approximately parallel openings, the direction of which is perpendicular to this drying front. There is, on the other hand, a secondary network of openings approximately perpendicular to the parallel network, for which the location and the distance between the strands are random.

At this stage of the implementation of the process, a network mask 1 is obtained.

Figure 3A:
FIG. 3a is an SEM view illustrating the profile of the opening of the mask.

A morphological study of the network mask 1 showed that the openings 10 have a straight mask area profile. Reference can be made to FIG. 3a which is a partial transverse view of the mask 1 obtained using SEM.

The profile is represented in FIG. 3a and has a particular advantage for:
  depositing, especially in a single step, a large thickness of material; and
  retaining a pattern, in particular of large thickness, that conforms to the mask after having removed the latter.

The network mask 1 thus obtained may be used as is or modified by various post-treatments.

The inventors have furthermore discovered that the use of a plasma source as a source for cleaning the organic particles located at the bottom of the opening made it possible, subsequently, to improve the adhesion of the material being used as the grid.

If there are no colloidal particles at the bottom of the openings, there will therefore be a maximum adhesion of the material that is introduced in order to fill the opening (this will be described in detail later on in the text) with the substrate having a glass function.

As an exemplary embodiment, cleaning with the aid of an atmospheric-pressure plasma source, with a transferred-arc plasma based on an oxygen/helium mixture, makes it possible both to improve the adhesion of the material deposited at the bottom of the openings and to widen the openings. A plasma source of the brand "ATOMFLOW" sold by Surfx may be used.

Figure 2C:
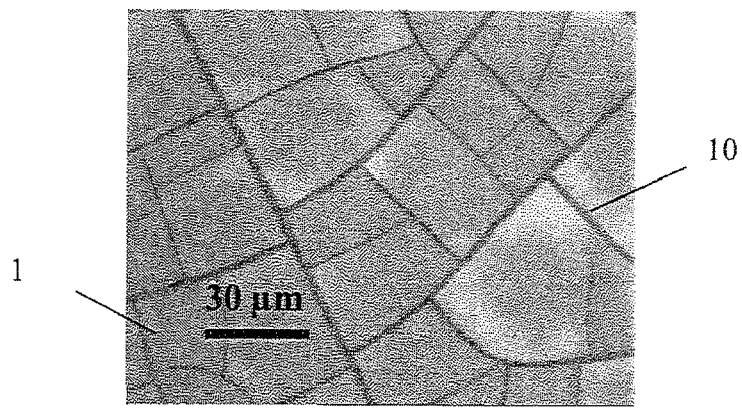

In another embodiment, a simple emulsion of colloidal particles based on an acrylic copolymer, which are stabilized in water at a concentration of 50 wt %, a pH of 3 and a viscosity equal to 200 mPa·s is deposited. The colloidal particles have a characteristic dimension of around 118 nm and are sold by DSM under the trademark Neocryl XK 38® and have a $T_g$ equal to 71° C. The network obtained is shown in FIG. 2c. The space between strands the openings is between 50 and 100 μm and the range of the widths of the strands openings is between 3 and 10 μm.

Figure 2D:
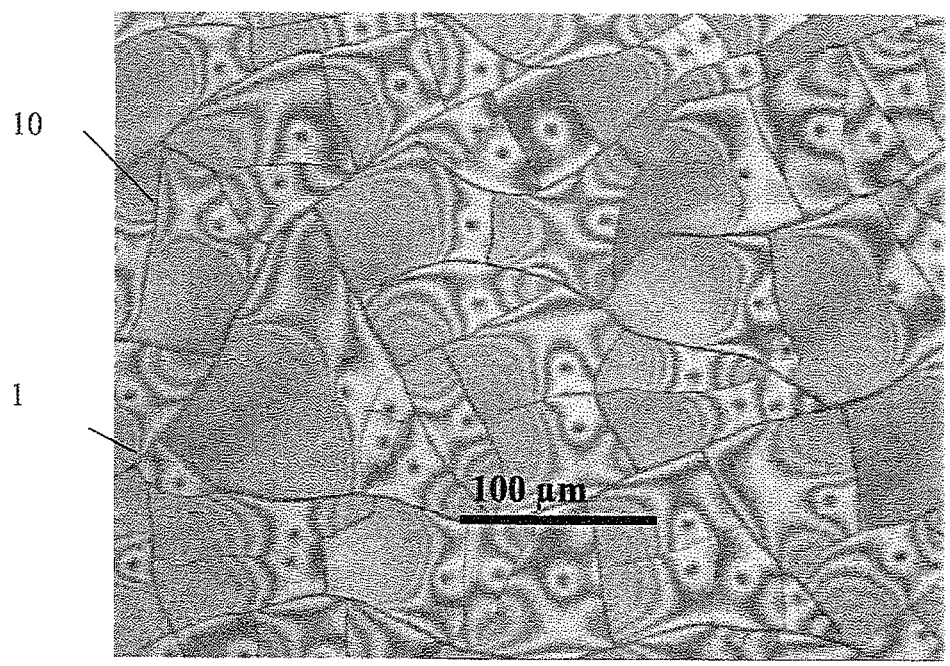

In another embodiment, a 40% solution of silica colloids with a characteristic dimension of around 10 to 20 nm, for example the product LUDOX® AS 40 sold by Sigma Aldrich, is deposited. The B/A ratio is around 30, as shown in FIG. 2d.

Typically, it is possible to deposit, for example, between 15% and 50% of silica colloids in an organic (especially aqueous) solvent.

Partial Removal

In the abovementioned examples, the mask occupies the entire face of the substrate. Once the network mask is obtained, one or more peripheral zones of the network mask are removed, for example by blowing, in order to create a zone free of masking.

Figure 3B:
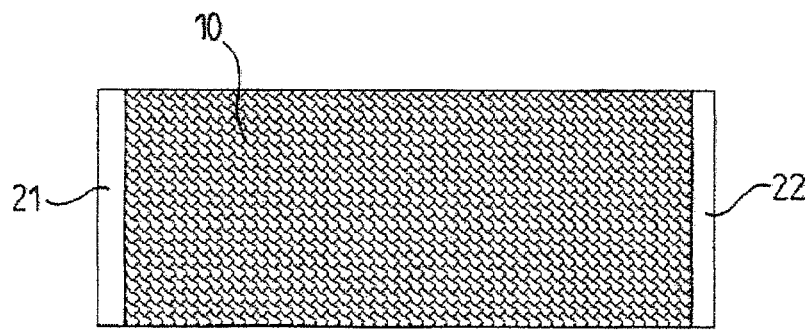
FIG. 3b schematically represents a front view of the network mask according to the invention with two zones free of masking according to the invention.
Figure 3C:
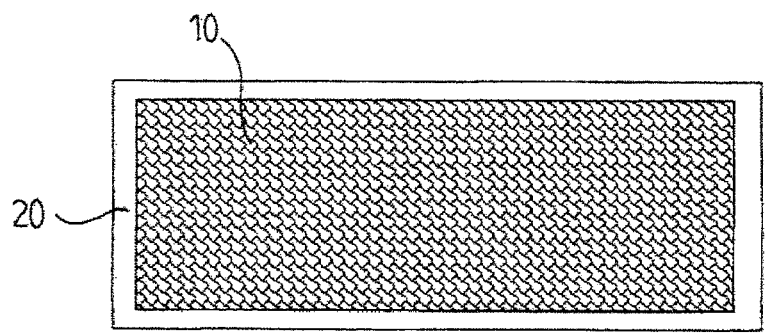
FIG. 3c schematically represents a front view of the network mask according to the invention with one zone free of masking according to the invention.

This removal may consist of:
  the removal of one or more peripheral strips of the mask 10, for example two lateral (or longitudinal) parallel rectangular strips 21, 22 as shown in FIG. 3b;
  an outlining, the zone free of masking 20 therefore framing the mask 10, as shown in FIG. 3c.

Figure 3D:
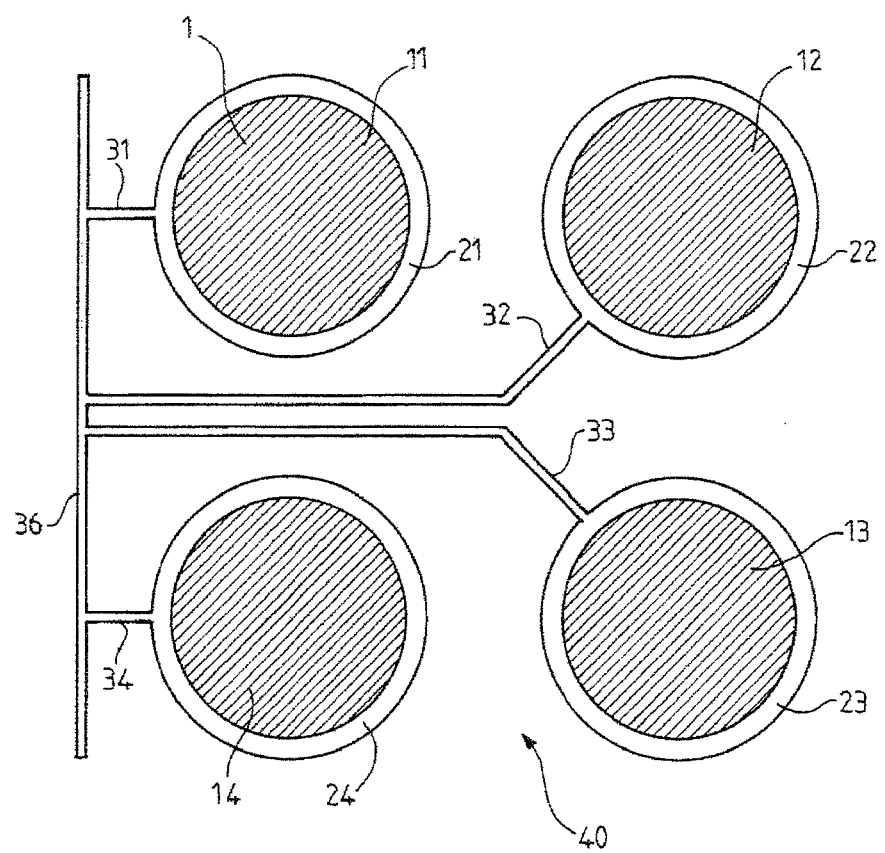
FIG. 3d schematically represents a front view of the network mask according to the invention with zones free of masking according to the invention.

FIG. 3d schematically represents a front view of the network mask according to the invention with zones free of masking according to the invention.

The network mask zone 1 is divided into four separate round regions 11 to 14. Each of the regions is surrounded by an annular zone free of masking 21 to 24, made by removing the network mask before depositing the grid material.

Each annular zone free of masking is connected by tracks free of masking 31 to 34 leading to a peripheral common track 35.

For the other zones 40, intended to be electrically insulating, a solid mask is used.

Electroconductive Deposition

After the partial removal of the mask, a grid connected to the connection system zone(s) is produced by electroconductive deposition.

In order to do this, an electroconductive material is deposited on the zone or zones free of masking and through the mask, until the openings are partially filled.

The material is chosen from electrically conductive materials such as aluminum, silver, copper, nickel, chromium, alloys of these metals, conductive oxides especially chosen from ITO, IZO, ZnO:Al; ZnO:Ga; ZnO:B; $SnO_2$:F; and $SnO_2$:Sb.

This deposition phase may be carried out, for example, by magnetron sputtering or by vapor deposition. The material is deposited inside the network of openings so as to fill the openings, the filling being carried out to a thickness for example of around half the height of the mask.

Mask Removal

In order to reveal the grid structure from the network mask, a "lift off" operation is carried out. This operation is facilitated by the fact that the cohesion of the nanoparticles results from weak van der Waals type forces (no binder, or bonding resulting from annealing).

The network mask is then immersed in a solution containing water and acetone (the cleaning solution is chosen as a function of the nature of the nanoparticles), then rinsed so as to remove all the parts coated with nanoparticles. The phenomenon can be accelerated due to the use of ultrasound to degrade the mask of nanoparticles and reveal the complementary parts (the network of openings filled by the material), which will form the grid.

Figure 4:
FIG. 4 represents a grid as a top view.

Represented in FIG. 4 is a photograph, obtained using SEM, of a grid 5 with its strands 50 thus obtained (without showing the connection system zone).

Given below are the electrical and optical characteristics obtained for aluminum-based grids.

|  | Rotational speed (rpm) | | | | | | | |
|---|---|---|---|---|---|---|---|---|
|  | 200 | | 400 | | 700 | | 1000 | |
|  | Al thickness (nm) | | | | | | | |
|  | 300 | 1000 | 300 | 1000 | 300 | 1000 | 300 | 1000 |
| Sheet R (Ω/□) | 2.1 | 0.65 | 2.4 | 0.7 | 3 | 0.9 | 3.1 | 0.95 |
| % $T_L$ | 79.8 | 79.3 | 81.9 | 82.1 | 83.2 | 83.1 | 84.9 | 83.9 |
| % $R_L$ | 14.7 | 15.0 | 14.6 | 14.2 | 13.1 | 12.4 | 11.7 | 11.6 |

Due to this particular grid structure, it is possible to obtain, at a lower cost, an electrode that is compatible with electrically controllable systems while having high electrical conductivity properties.

Figure 7:
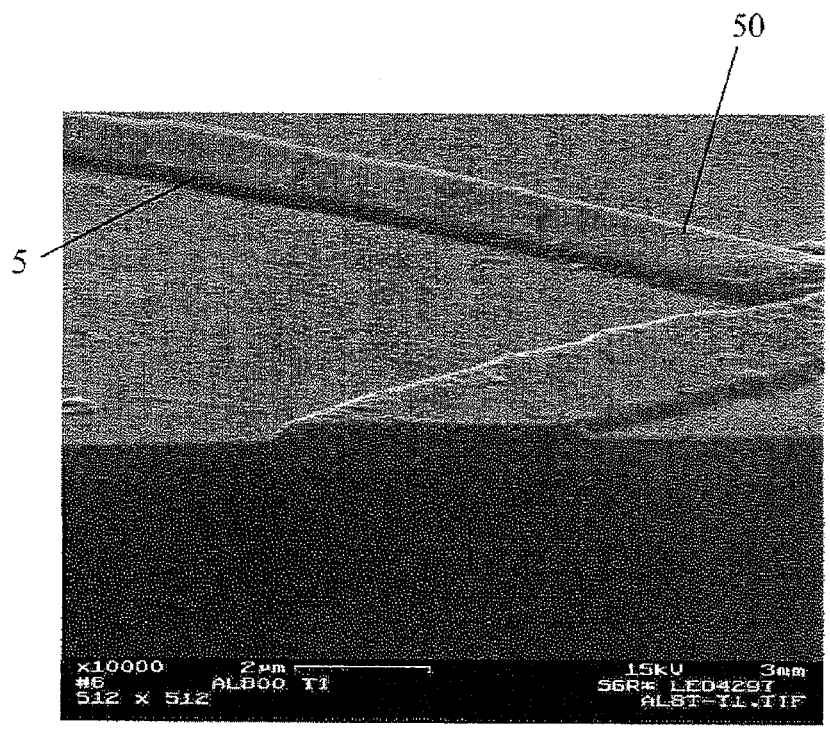
FIGS. 7 and 8 represent partial SEM views of a grid.
Figure 8:
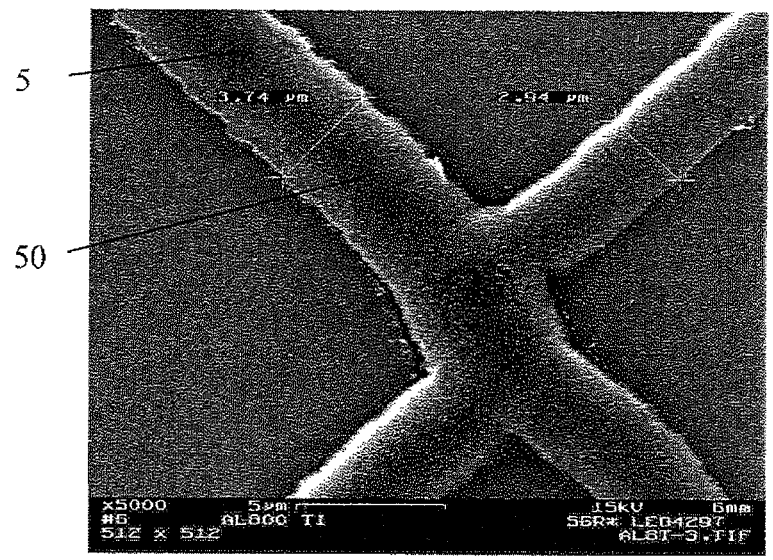

FIGS. 7 and 8 show SEM detailed top (perspective) views of the strands of a grid 5 made of aluminum. It is observed that the strands 50 have relatively smooth and parallel edges.

The electrode incorporating the grid 5 according to the invention has an electrical resistivity between 0.1 and 30 ohm/square and an LT of 70 to 86%, which makes its use as a transparent electrode completely satisfactory.

Preferably, especially to achieve this level of resistivity, the metal grid has a total thickness between 100 nm and 5 μm.

In these thickness ranges, the electrode remains transparent, that is to say that it has a low light absorption in the visible range, even in the presence of the grid (its network is almost invisible owing to its dimensions).

The grid has an aperiodic or random structure in at least one direction that makes it possible to avoid diffractive phenomena and results in 15 to 25% light occultation.

For example, a network as represented in FIG. 4 having metal strands 50 that have a width of 700 nm and are spaced 10 μm apart gives a substrate a light transmission of 80% compared with a light transmission of 92% when bare.

Another advantage of this embodiment consists in that it is possible to adjust the haze value in reflection of the grids.

For example, for an inter-strand spacing (dimension B') of less than 15 μm, the haze value is around 4 to 5%.

For a spacing of 100 μm, the haze value is less than 1%, with B/A being constant.

For a strand spacing B' of around 5 μm and a strand size A' of 0.3 μm, a haze of around 20% is obtained. Beyond a haze value of 5%, it is possible to use this phenomenon as a means for removing light at the interfaces or a means of trapping light.

Before depositing the network mask material, it is possible to deposit, in particular by vacuum deposition, a sublayer that promotes the adhesion of the grid material.

Figure 9:
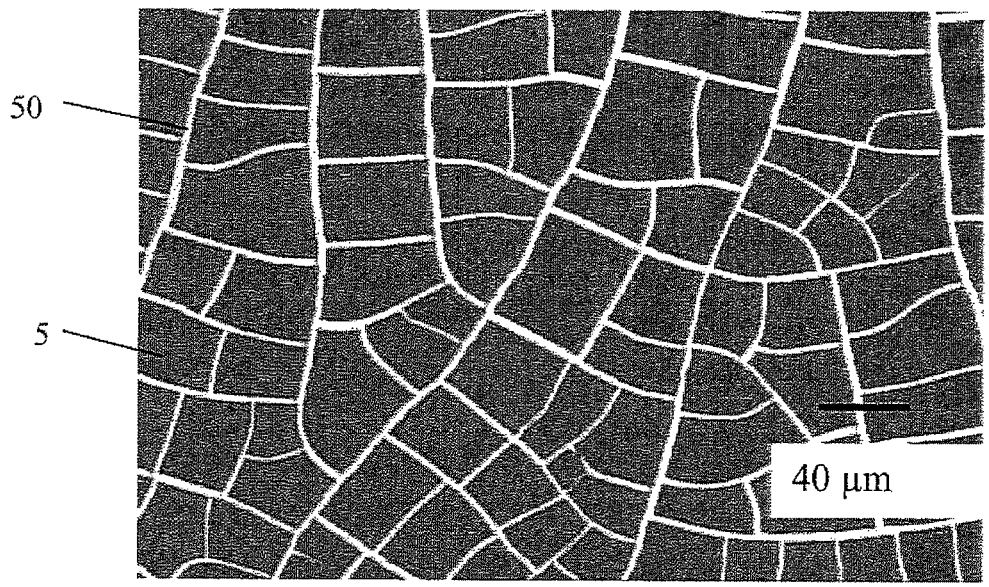
FIGS. 9 and 10 represent grids as top views.

For example, nickel is deposited and, as the grid material, aluminum. This grid is shown in FIG. 9.

For example, ITO, NiCr or else Ti is deposited and, as grid material, silver.

In order to increase the thickness of the metal layer and thus reduce the electrical resistance of the grid a copper overlayer has been deposited by electrolysis (soluble anode method) on the silver grid.

The glass covered with the adhesion-promoting sublayer and with the silver grid via magnetron sputtering constitutes the cathode of the experimental device; the anode is composed of a sheet of copper. It has the role, by dissolving, of keeping the concentration of $Cu^{2+}$ ions, and thus the deposition rate, constant throughout the deposition process.

The electrolysis solution (bath) is composed of an aqueous solution of copper sulfate ($CuSO_4.5H_2O$=70 gl$^{-1}$) to which 50 ml of sulfuric acid ($H_2SO_4$, 10N) are added. The temperature of the solution during the electrolysis is 23±2° C.

The deposition conditions are the following: voltage ≤1.5 V and current ≤1 A.

The anode and the cathode, spaced from 3 to 5 cm apart and of the same size, are positioned parallel in order to obtain perpendicular field lines.

Figure 10:
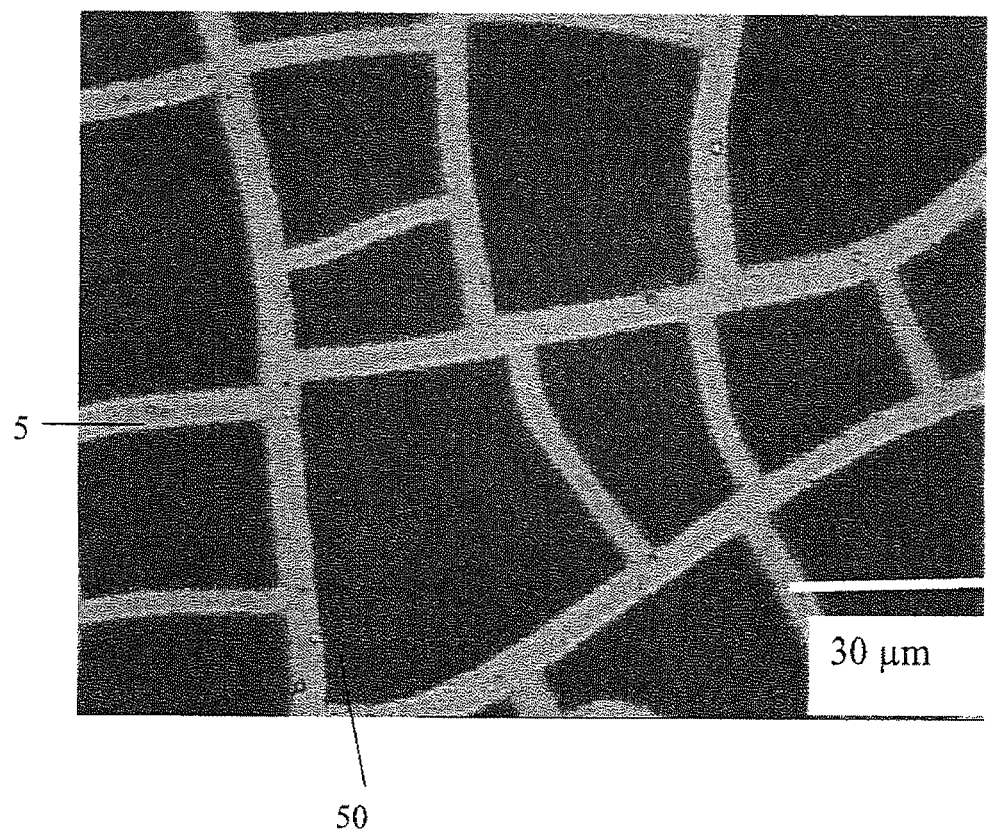

The layers of copper are homogeneous on the silver grids. The thickness of the deposition increases with the electrolysis time and the current density and also the morphology of the deposition. The results are shown in the table below and in FIG. 10.

| Sample | Reference 500 nm Ag | With 0.5 μm Cu | With 1 μm Cu |
|---|---|---|---|
| $T_L$ (%) | 75 | 70 | 66-70 |
| Haze (%) | 2.5 | 3.0 | 3.0 |
| Sheet R (Ω) | 3 | 2 | 0.2 |

The SEM observations (made on these grids) show that the size of the meshes is 30 μm±10 μm and the size of the strands is between 2 and 5 μm.

As mentioned above, the invention may be applied to various types of electrically controllable, especially electrochemical, systems within which the electroconductive grid, with its connection system, may be integrated as a connected active layer (as an electrode, heating layer or electromagnetic shielding layer).

A first category of systems comprises electrochromic systems, especially "all solid" ones (the term "all solid" being defined, within the context of the invention, in respect of the multilayer stacks for which all the layers are of inorganic nature) or "all polymer" ones (the term "all polymer" being defined, within the context of the invention, in respect of the multilayer stacks for which all the layers are of organic nature), or else for mixed or hybrid electrochromic systems (in which the layers of the stack are of organic nature and inorganic nature) or else liquid-crystal or viologen systems.

In this type of device a single connection system zone may suffice, for example one lateral or longitudinal rectangular strip or frame may be chosen.

The same is true for (flat and/or UV) discharge lamps with phosphor(s) as the active element.

The electroconductive grid thus produced may also form electromagnetic shielding; a single connection system zone may then suffice, for example one lateral or longitudinal rectangular strip or frame may be chosen. For example, the mask described in FIG. 3c is chosen.

The electroconductive grid thus produced may, in addition, also form a heating grid, especially in a windshield; two connection system zones are then needed, for example two rectangular strips on two opposite edges (lateral, longitudinal, etc.) may be chosen. For example, the mask described in FIG. 3c is chosen.

Naturally, it is also possible, after manufacture of the grid, to split the electroconductive grid and/or the connection system zone(s) into several regions, for example by selective chemical etching (screen-printing paste for example) or by laser.

The electroconductive grid may, in addition, be used as a lower electrode of a light-emitting system, especially an organic light-emitting system (OLED). Two connection system zones that are electrically insulated from each other are then needed, the first being in electrical contact with the grid, the second being electrically insulated from the grid and being used as the upper electrode.

For example, four peripheral strips are formed, two lateral peripheral strips for the lower electrode (closest to the substrate) and two longitudinal peripheral strips for the upper electrode.

Next, after formation of the grid, the second' connection system zone (the two longitudinal peripheral strips in this case) is separated, for example by selective chemical etching (screen-printing paste for example) or by laser, from the grid.

The invention claimed is:

1. A process for manufacturing a submillimetric electroconductive grid on a main face of a substrate, comprising:
   (a) depositing an electroconductive material,
      (i) on the main face, through submillimetric openings of a network mask until a fraction of a depth of the submillimetric openings is filled, the network mask obtained by
         depositing a liquid masking layer as a solution and drying the liquid masking layer, wherein:
            for said liquid masking layer, a solution of colloidal nanoparticles stabilized and dispersed in a solvent is deposited, the nanoparticles having a glass transition temperature $T_g$;
            said drying of the masking layer is carried out at a temperature below said temperature $T_g$ until the network mask having a two-dimensional network of the submillimetric openings is obtained with substantially straight mask area edges, the network mask being on a network mask zone, and
      prior to depositing the electroconductive material, forming a zone free of masking on said main face by mechanical and/or optical removal of at least one peripheral portion of the network mask zone,
      (ii) and on the zone free of masking so that the electroconductive material connects the zone free of masking to the submillimetric openings; and
   (b) removing the network mask revealing the submillimetric electroconductive grid.

2. The process for manufacturing a grid as claimed in claim 1, wherein the network mask is removed by a liquid route.

3. The process for manufacturing a grid as claimed in claim 2, wherein the network mask is removed by an aqueous solvent.

4. The process for manufacturing a grid as claimed in claim 1, wherein the solution of colloidal nanoparticles is deposited on a hydrophilic surface.

5. The process for manufacturing a grid as claimed in claim 1, wherein the nanoparticles are polymeric and/or the nanoparticles are inorganic.

6. The process for manufacturing a grid as claimed in claim 5, wherein the polymeric nanoparticles are made with acrylic copolymers, polystyrenes, poly(meth)acrylates, polyesters or blends thereof.

7. The process for manufacturing a grid as claimed in claim 5, wherein the inorganic nanoparticles are made with silica, alumina or iron oxide.

8. The process for manufacturing a grid as claimed in claim 1, wherein the masking layer is dried at a temperature below 50° C.

9. The process for manufacturing a grid as claimed in claim 8, wherein the temperature is ambient temperature.

10. The process for manufacturing a grid as claimed in claim 1, wherein the shape and the size of the colloidal nanoparticles are not substantially modified by the drying.

11. The process for manufacturing a grid as claimed in claim 1, wherein a thickness of the network mask is between 1 and 100 microns.

12. The process for manufacturing a grid as claimed in claim 11, wherein the thickness of the network mask is between 2 and 50 microns.

13. The process for manufacturing a grid as claimed in claim 1, wherein the network mask has a ratio of a distance between the openings (B) to a submillimetric width of the openings (A) between 7 and 40 and/or a width (A) between 200 nm and 50 µm and a distance (B) between the openings between 5 and 500 µm.

14. The process for manufacturing a grid as claimed in claim 1, wherein the grid has an aperiodic or random structure in at least one direction.

15. The process for manufacturing a grid as claimed in claim 14, wherein the grid has an aperiodic or random structure in two directions.

16. The process for manufacturing a grid as claimed in claim 1, wherein the electroconductive grid has a sheet resistance between 0.1 and 30 ohm/square.

17. The process for manufacturing a grid as claimed in claim 1, wherein a light transmission of the substrate coated with the grid is greater than 70% and/or the light transmission, in a given IR band, of the substrate coated with the grid is greater than 70% and/or the light transmission, in a given UV band, of the substrate coated with the grid is greater than 70%.

18. The process for manufacturing a grid as claimed in claim 1, wherein a light transmission of the substrate coated with the grid is between 70% and 86% and/or the light transmission, in a given IR band, of the substrate coated with the grid is between 70% and 86% and/or the light transmission, in a given UV band, of the substrate coated with the grid is between 70% and 86%.

19. The process for manufacturing a grid as claimed in claim 1, wherein prior to depositing the electroconductive material, the process comprises masking part of the main face of the substrate to define an electrically insulating zone in which the deposition of the electroconductive material is prevented in said part of the main face of the substrate.

20. The process for manufacturing a grid as claimed in claim 1, wherein the electroconductive material is deposited simultaneously through the submillimetric openings and on the zone free of masking.

* * * * *